(12) United States Patent
Drane et al.

(10) Patent No.: US 12,353,808 B2
(45) Date of Patent: Jul. 8, 2025

(54) APPARATUS, DEVICE, METHOD, AND COMPUTER PROGRAM FOR GENERATING A REGISTER TRANSFER LEVEL REPRESENTATION OF A CIRCUIT

(71) Applicant: Intel Corporation, Santa Clara, CA (US)

(72) Inventors: Theo Drane, El Dorado Hills, CA (US); Samuel Coward, London (GB); George Constantinides, London (GB)

(73) Assignee: Intel Corporation, Santa Clara, CA (US)

( * ) Notice: Subject to any disclaimer, the term of this patent is extended or adjusted under 35 U.S.C. 154(b) by 642 days.

(21) Appl. No.: 17/649,937

(22) Filed: Feb. 4, 2022

(65) Prior Publication Data
US 2022/0366112 A1    Nov. 17, 2022

(51) Int. Cl.
*G06F 30/327* (2020.01)

(52) U.S. Cl.
CPC .................. *G06F 30/327* (2020.01)

(58) Field of Classification Search
CPC ...... G06F 30/32; G06F 30/327; G06F 30/343; G06F 30/3323; G06F 30/337; G06F 30/398
USPC ........................................... 716/104
See application file for complete search history.

(56) References Cited

U.S. PATENT DOCUMENTS

| | | | |
|---|---|---|---|
| 2023/0034406 A1* | 2/2023 | Choi | G06F 30/327 |
| 2023/0214574 A1* | 7/2023 | Korchemny | G06F 30/3323 |
| | | | 716/111 |

OTHER PUBLICATIONS

Willsey, Max, et al. "Egg: Fast and extensible equality saturation." Proceedings of the ACM on Programming Languages 5.POPL (2021): 1-29.1.
A. K. Verma, P. Brisk and P. Ienne, "Data-Flow Transformations to Maximize the use of Carry-Save Representation in Arithmetic Circuits".

* cited by examiner

*Primary Examiner* — Paul Dinh
(74) *Attorney, Agent, or Firm* — 2SPL Patent Attorneys PartG mbB; Yong Beom Hwang

(57) ABSTRACT

Examples relate to an apparatus, a device, a method, and a computer program for generating a register transfer level (RTL) representation of a circuit. The apparatus comprises processing circuitry configured to generate a graph representation of the circuit, the graph representation comprising a first set of vertices representing operators and a second set of vertices representing operands of the RTL representation of the circuit. The processing circuitry is configured to determine, for one or more operators represented by the one or more vertices of the first set of vertices of the graph, one or more logically equivalent operators. The processing circuitry is configured to include the one or more logically equivalent operators in the graph representation, such that the graph representation comprises a plurality of logically equivalent representations of the circuit. The processing circuitry is configured to generate an RTL representation of the circuit based on one of the plurality of equivalent representations of the circuit.

22 Claims, 7 Drawing Sheets

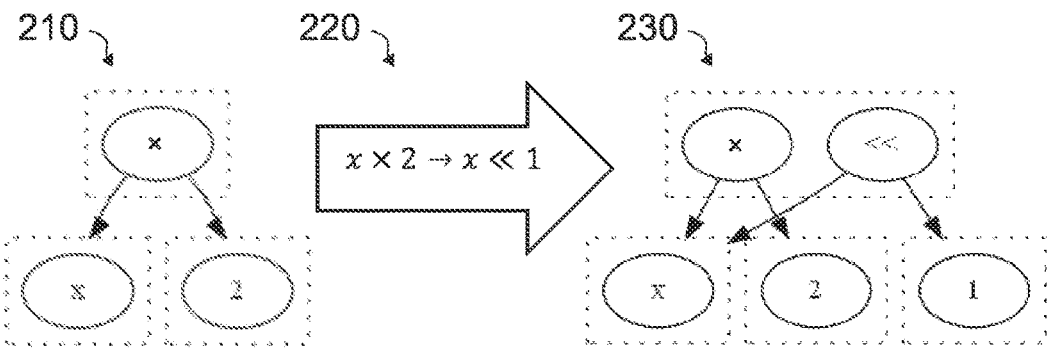
Fig. 2
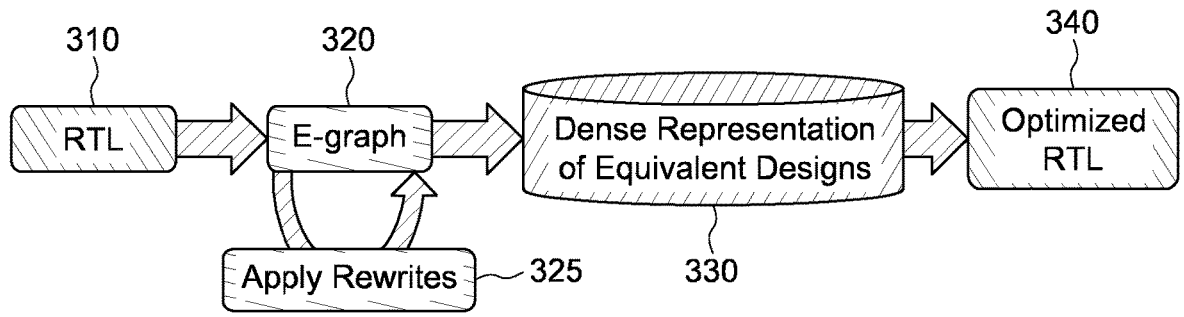
Fig. 3
| Operator | Symbol | Arity | Architecture |
|---|---|---|---|
| Left/Right Shift | << / >> | 2 | Barrel Shifter |
| Addition/Subtraction | +/- | 2 | Prefix Adder (PA) |
| Negation | - | 1 | PA |
| Multiplication | × | 2 | Booth Radix-4 |
| Multiplexer | ·?·:· | 3 | Mux gates |
| Not/Inversion | ~ | 1 | One-input gates |
| Concatenate/Truncate | {,} | n | Wiring |
| Comparison | > / < | 2 | PA |
| Sum | SUM | n | Reduction and PA |
| Mux Array | MUXAR | 3 | Booth Radix-4 |
| Fused Multiply Add | FMA | 3 | Booth Radix-4 |
Fig. 4

| Class | Name | Left-hand Side → Right-hand Side | Sufficient Condition |
|---|---|---|---|
| Bitvector Arithmetic Identities | Commutativity | $_r(_pa *_qb) \rightarrow _r(_qb *_pa)$ | True |
| | Mult Associativity | $_t(_u(_pa \times_r b) \times_s c) \rightarrow _t(_pa \times_q(_rb \times_s c))$ | $(q \geq t \vee r+s \leq q) \wedge (u \geq t \vee p+r \leq u)$ |
| | Add Associativity | $_t(_u(_pa +_r b) +_s c) \rightarrow _t(_pa +_q(_rb +_s c))$ | $(q \geq t \vee \max(r,s) < q) \wedge (u \geq t \vee \max(p,r) < u)$ |
| | Distribute Mult over Add | $_r(_pa \times_q(_sb +_t c)) \rightarrow _r(_u(_pa \times_s b) +_v(_pa \times_t c))$ | $\min(q, u, v) \geq r$ |
| | Sum Same | $_p(_pa +_pa) \rightarrow _p(2 \times _pa)$ | True |
| | Mult Sum Same | $_r(_q(_pa \times _qb) +_qb) \rightarrow _r(_q(_pa +_p 1) \times _qb)$ | True |
| | Add Zero | $_p(_pa +_qb) \rightarrow _p(a)$ | $b \equiv 0 \mod 2^p$ |
| | Sub to Neg | $_p(_pa -_qb) \rightarrow _p(_pa +_p(-_qb))$ | True |
| | Mult by One | $_p(_pa \times _qb) \rightarrow _p(a)$ | $b \equiv 1 \mod 2^p$ |
| | Mult by Two | $_r(_pa \times_q 2) \rightarrow _r(_pa <<_1 1)$ | True |
| Bitvector Logic Identities | Merge Left Shift | $_r(_u(_pa <<_q b) <<_s c) \rightarrow _r(_pa <<_t(_qb +_s c))$ | $t > \max(q,s) \wedge u \geq r$ |
| | Merge Right Shift | $_r(_u(_pa >>_q b) >>_s c) \rightarrow _r(_pa >>_t(_qb +_s c))$ | $t > \max(q,s) \wedge u \geq p$ |
| | Redundant Sel | $_r(_p(1b? _pa : _pa) \rightarrow _pa$ | $r \leq p$ |
| | Neg Not | $_r(-_pa) \rightarrow _r(_p(\sim_pa)) +_pa$ | True |
| | Not Neg | $_r(_p(\sim(_pa)) +1) \rightarrow _r(-_pa)$ | True |
| | Not over Con | $_r(\sim(_{q+s}(_qa,_sb))) \rightarrow _r(_q(\sim(_qa)), _s(\sim(_sb)))$ | $q+s \geq r$ |
| Constant Expansion | Mult Constant | $_r(_p(_q(2^2 \times_{q-1} c[q-1];_r(_1 1 \times_p x) \rightarrow 1]))(_{22} \times_p x) -_p x)$ | $c$ constant $\wedge$ |
| | One to Two Mult | $_r(_q c \times_p x) \rightarrow _r(_p(_1c[0] \times_p x)) +_r(_p(_1c[0] \times_p x))$ | $p \geq r \wedge q \geq r$ |
| Arithmetic Logic Exchange | Left Shift Add | $_r(_s(_pa +_q b) <<_u c) \rightarrow _r(_u(_pa <<_t c) +_u(_qb <<_t c))$ | $(s \geq r \vee \max(p,q) < s) \wedge u \geq r$ $t \geq r \wedge q \geq r$ |
| | Add Right Shift | $_r(_p(_pa +_q b) >>_u c) \rightarrow _r(_v(_pa >>_u c) \times_u c)$ | $t \geq r \wedge q \geq r$ |
| | Left Shift Mult | $_r(_v(_pa \times_q b) <<_u c) \rightarrow _r(_v(_pa <<_u c) \times_u c)$ | $s \geq p + 2^u - 1 \wedge v > \max(s,t)$ |
| | Sel Add | $_r(_1e? _r(_pa +_q b) : _r(_pc +_q d)) \rightarrow _r(_p(_1e? _pa : _pc) +_q(_1e? _qb : _qd))$ | $t \geq r \wedge v \geq r$ |
| | Sel Add Zero | $_p(_1b? _p 0 : _pa) \times _qc) \rightarrow _p(_1e? _pa : _pc) +_q(_1b? _q 0 : _qc))$ | True |
| | Move Sel Zero | $_r(_p(_1b? _p 0 : _pa) \times _qc) \rightarrow _r(_p(_1b? _p 0 : _p(_pa \times_q c)))$ | True |
| | Concat to Add | $_r(_{p+s}(_pa,_sb)) \rightarrow _r(_s(_pa <<_u q) +_qb)$ | True |
| Merging Ops | Merge Additions | $_q(_{p_1}a1 +_{q_2}(_{p_2}a2 +_{q_3}(_{p_3}a3 + ... +_{p_n} an)...) \rightarrow _q(SUM(_{p_1}a1, _{p_2}a2, ..., _{p_n}an))$ | $q_i > \max(p_i, q_{i+1}), i = 1, ..., n-2$ $\wedge q_{n-1} > \max(p_{n-1}, p_n)$ |
| | Mux Array | $_t(_s(_qa \times_r b) +_r c) \rightarrow _t(MUXAR(_rb, _qa, _qc))$ | $s \geq q + r \wedge t > s \max(s,r)$ |
| | FMA Merge | $_t(_s(_pa \times_q b) +_r c) \rightarrow _t(FMA(_pa,_qb,_rc))$ | $p + q \wedge t > s \max(s,r)$ |

Fig. 5

APPARATUS, DEVICE, METHOD, AND COMPUTER PROGRAM FOR GENERATING A REGISTER TRANSFER LEVEL REPRESENTATION OF A CIRCUIT

BACKGROUND

The design of hardware circuits is often performed through different levels of abstraction, from high-level hardware description languages to the low-level design of the transistors and other components. One abstraction level is the so-called register transfer level (RTL) abstraction level, which is used in hardware description languages like Verilog or VHDL (Very High Speed Integrated Circuits Hardware Description Language). A representation of a circuit on the RTL abstraction level is subsequently synthesized to a netlist, and ultimately to a circuit design to be used for manufacturing the integrated circuit.

Hardware languages provide a multitude of possibilities for implementing a given functionality, leading to a large design space. Such a large design space may render any improvement or optimization of the circuit design more difficult, as the number of possible implementations is large, and an estimation of the hardware implementation cost often is not straightforward.

High Level Synthesis (HLS) has attempted to address this challenge by increasing the level of abstraction in circuit design. However, HLS only supports a limited number of formats, which is insufficient in a domain such as graphics where deviation from IEEE (Institute of Electrical and Electronics Engineers) standards may be considered essential. HLS also fails to reuse hardware for different datatypes, never merging floating point and integer code. Logic synthesis includes many optimizations that it can deploy on RTL designs. In particular for arithmetic circuits, logic synthesis only explores a local region of design space close to the RTL implementation supplied and rarely crosses the architectural boundaries. Manual RTL optimization, while being slow, is still commonplace and can often outperform automated tools, such as those described above, while carrying the danger of introducing bugs in the design.

Prior academic work looked to exploit carry-save representation via an automatic optimization algorithm. However, the work is limited to this one type of logic synthesis optimization, therefore opportunities for optimizations are missed by this technique.

BRIEF DESCRIPTION OF THE FIGURES

Some examples of apparatuses and/or methods will be described in the following by way of example only, and with reference to the accompanying figures, in which

FIG. 2 shows an illustration of an example of equality graph rewriting;

FIG. 3 shows a flow chart of an example of a transformation of a register transfer level design into a graph representation, and of an extraction of a register transfer level representation;

FIG. 4 shows a table of an example of operators used to improve arithmetic circuits;

FIG. 5 shows a table of an example of a set of rewrites;

DETAILED DESCRIPTION

Figure 1A:
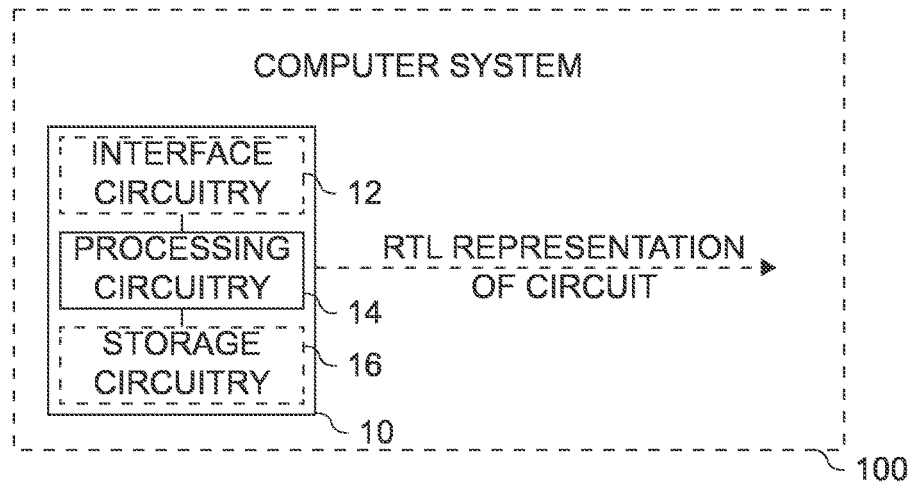
FIG. 1a shows a block diagram of an example of an apparatus or device for generating a register transfer level representation of a circuit, and of a computer system comprising such an apparatus or device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

In the following description, specific details are set forth, but examples of the technologies described herein may be practiced without these specific details. Well-known circuits, structures, and techniques have not been shown in detail to avoid obscuring an understanding of this description. "An example/example," "various examples/examples," "some examples/examples," and the like may include features, structures, or characteristics, but not every example necessarily includes the particular features, structures, or characteristics.

Some examples may have some, all, or none of the features described for other examples. "First," "second," "third," and the like describe a common element and indicate different instances of like elements being referred to. Such adjectives do not imply element item so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform, or resource, even though the instructions contained in the software or firmware are not actively being executed by the system, device, platform, or resource.

The description may use the phrases "in an example/example," "in examples/examples," "in some examples/examples," and/or "in various examples/examples," each of which may refer to one or more of the same or different examples. Furthermore, the terms "comprising," "including," "having," and the like, as used with respect to examples of the present disclosure, are synonymous.

FIG. 1a shows a block diagram of an example of an apparatus 10 or device 10 for generating a register transfer level (RTL) representation of a circuit. The apparatus 10 comprises circuitry that is configured to provide the functionality of the apparatus 10. For example, the apparatus 10 of FIGS. 1a and 1b comprises (optional) interface circuitry 12, processing circuitry 14 and (optional) storage circuitry 16. For example, the processing circuitry 14 may be coupled with the interface circuitry 12 and with the storage circuitry 16. For example, the processing circuitry 14 may be configured to provide the functionality of the apparatus, in conjunction with the interface circuitry 12 (for exchanging information, e.g., with other components of the computer system) and the storage circuitry 16 (for storing information). Likewise, the device 10 may comprise means that is/are configured to provide the functionality of the device 10. The components of the device 10 are defined as component means, which may correspond to, or implemented by, the respective structural components of the apparatus 10. For example, the device 10 of FIGS. 1a and 1b comprises means for processing 14, which may correspond to or be implemented by the processing circuitry 14, (optional) means for communicating 12, which may correspond to or be implemented by the interface circuitry 12, and (optional) means for storing information 16, which may correspond to or be implemented by the storage circuitry 16.

The processing circuitry 14 or means for processing 14 is configured to generate a graph representation of the circuit. The graph representation comprises a first set of vertices representing operators and a second set of vertices representing operands of the RTL representation of the circuit. The processing circuitry 14 or means for processing 14 is configured to determine, for one or more operators represented by the one or more vertices of the first set of vertices of the graph, one or more logically equivalent operators. The processing circuitry 14 or means for processing 14 is configured to include the one or more logically equivalent operators in the graph representation, such that the graph representation comprises a plurality of logically equivalent representations of the circuit. The processing circuitry 14 or means for processing 14 is configured to generate an RTL representation of the circuit based on one of the plurality of equivalent representations of the circuit.

FIG. 1a further shows an example of a computer system 100 comprising the apparatus 10 or device 10.

Figure 1B:
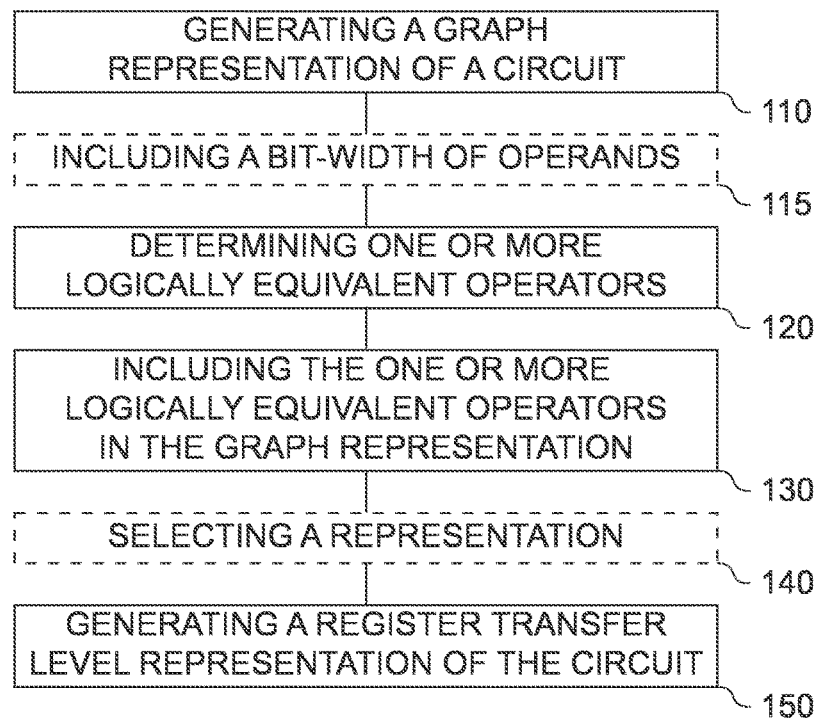
FIG. 1b shows a flow chart of an example of a method for generating a register transfer level representation of a circuit.

FIG. 1b shows a flow chart of an example of a corresponding method for generating a register transfer level representation of a circuit. The method comprises generating 110 the graph representation of the circuit. The method comprises determining 120, for the one or more operators represented by the one or more vertices of the first set of vertices of the graph, the one or more logically equivalent operators. The method comprises including 130 the one or more logically equivalent operators in the graph representation, such that the graph representation comprises a plurality of logically equivalent representations of the circuit. The method comprises generating 150 an RTL representation of the circuit based on one of the plurality of equivalent representations of the circuit.

For example, the method may be performed by a computer system, e.g., by processing circuitry 14 of the computer system 100 shown in FIG. 1a.

In the following, the functionality of the apparatus 10, of the device 10, of the method, of a corresponding computer program, and of the computer system is illustrated with respect to the apparatus 10. Features introduced with respect to the apparatus 10 may likewise be introduced in the corresponding device, method, computer program and computer system.

The present disclosure relates to a concept for improving or optimizing a circuit design in digital hardware design. In digital hardware design, hardware description languages, such as Verilog or VHDL, are often used to define the functionality of a circuit. While such hardware description languages are powerful tools for specifying the functionality of a circuit on the register transfer level (and above), they allow the definition of a circuit design without taking into account hardware structures, such as custom-designed hardware blocks, which would allow to improve the implementation cost or processing delay caused by the respective circuit design. While logic synthesis tools are often equipped to provide some level of improvement or optimization, such tools are often limited to a narrow design space. Manual improvements may be used to overcome this limitation, at the cost of additional manual effort and the risk of introducing bugs in edge cases.

The proposed concept may provide additional improvements to circuit designs, e.g., by generating an improved RTL representation of a circuit that is logically equivalent to an initial (RTL) representation of the circuit, albeit with advantageous properties. In the following, the terms "improved" and "optimized" are used interchangeably. The term "optimized", or "optimization" does not necessarily imply that the result of the process is the optimal version. In the present concept, the term "optimized" indicates that some thing (i.e., the circuit design) is superior to the initial version of the thing (i.e., the circuit design).

The process starts with generating the graph representation of the circuit. This can occur from any source, e.g., from a higher-abstraction level representation of the circuit such as SystemVerilog, or from another RTL representation of the circuit, e.g., as defined in the Verilog or VHDL hardware description language. In other words, the processing circuitry may be configured to generate the graph representation from a further RTL representation of the circuit. Thus, the proposed concept may be used to improve or optimize an existing RTL representation of the circuit.

In general, the graph representation of the circuit may model a data flow between the components of the circuits, i.e., the graph representation may be a data-flow graph representing the circuit. The graph representation comprises two types of vertices (i.e., nodes)—vertices of the first set of vertices that represent operators, and vertices of the second set of vertices that represent operands. The vertices representing the operands are connected to the vertices representing the operators via the edges of the graph structures. Moreover, vertices representing operators may be connected to other vertices representing operators as well, with the result of an operation performed by an operator being used as operand by the other operator. Thus, the output of an operation performed by an operator may be provided as operand to another operator, or as an output of the circuit. An example of such a graph representation is given in FIGS. 8 to 10.

Figure 8:
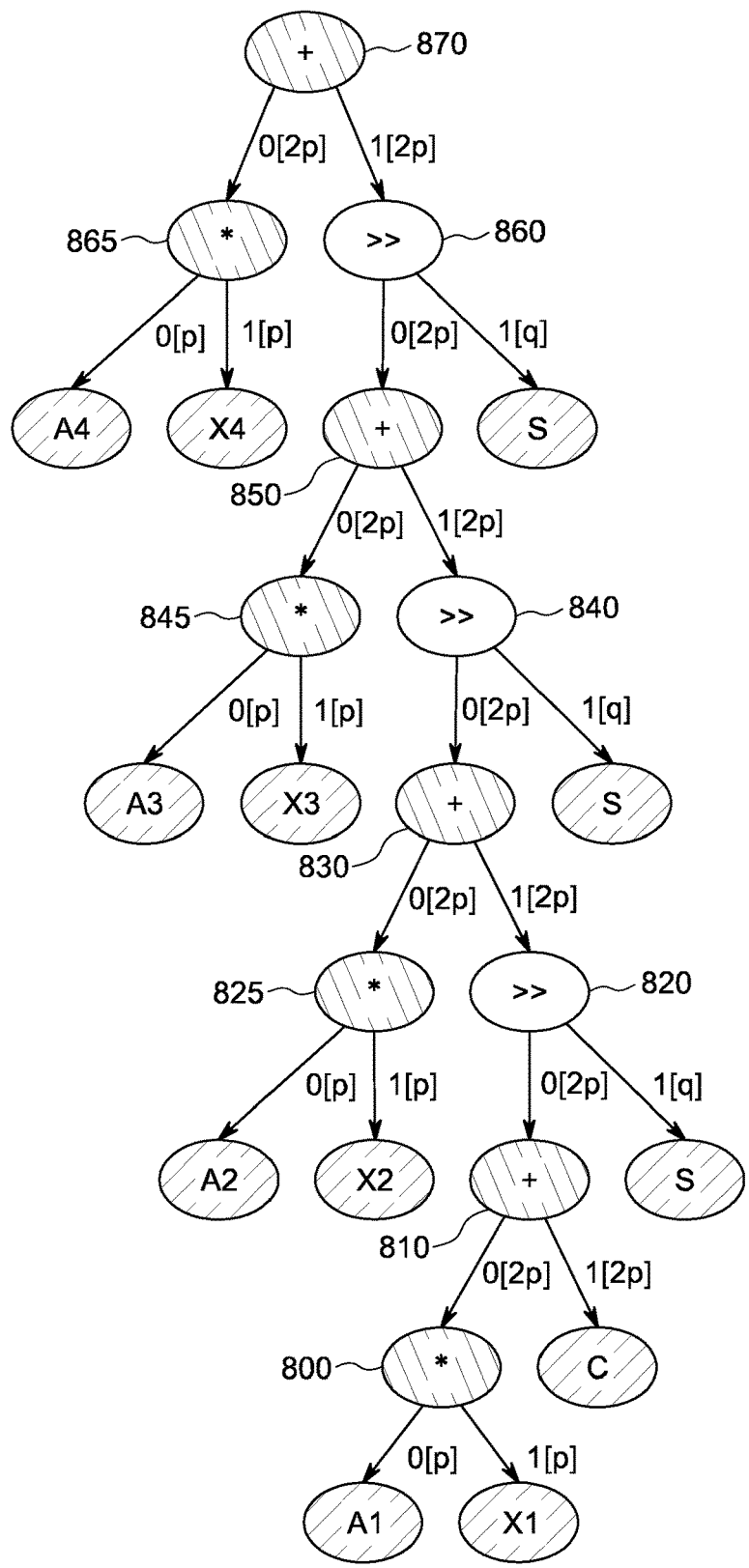
FIGS. 8 to 10 shows graphs of examples of different representations of a circuit.
Figure 9:
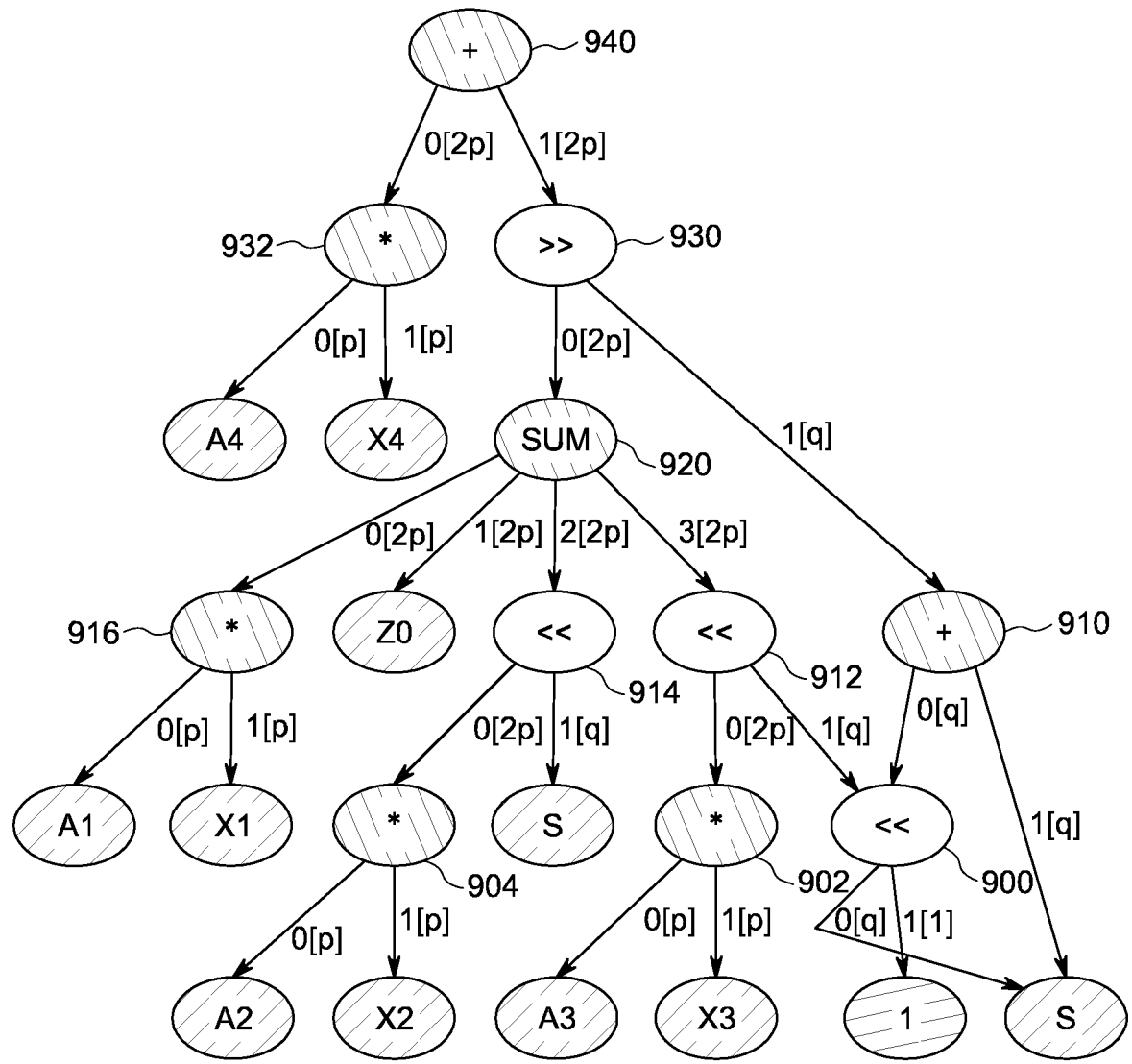
Figure 10:
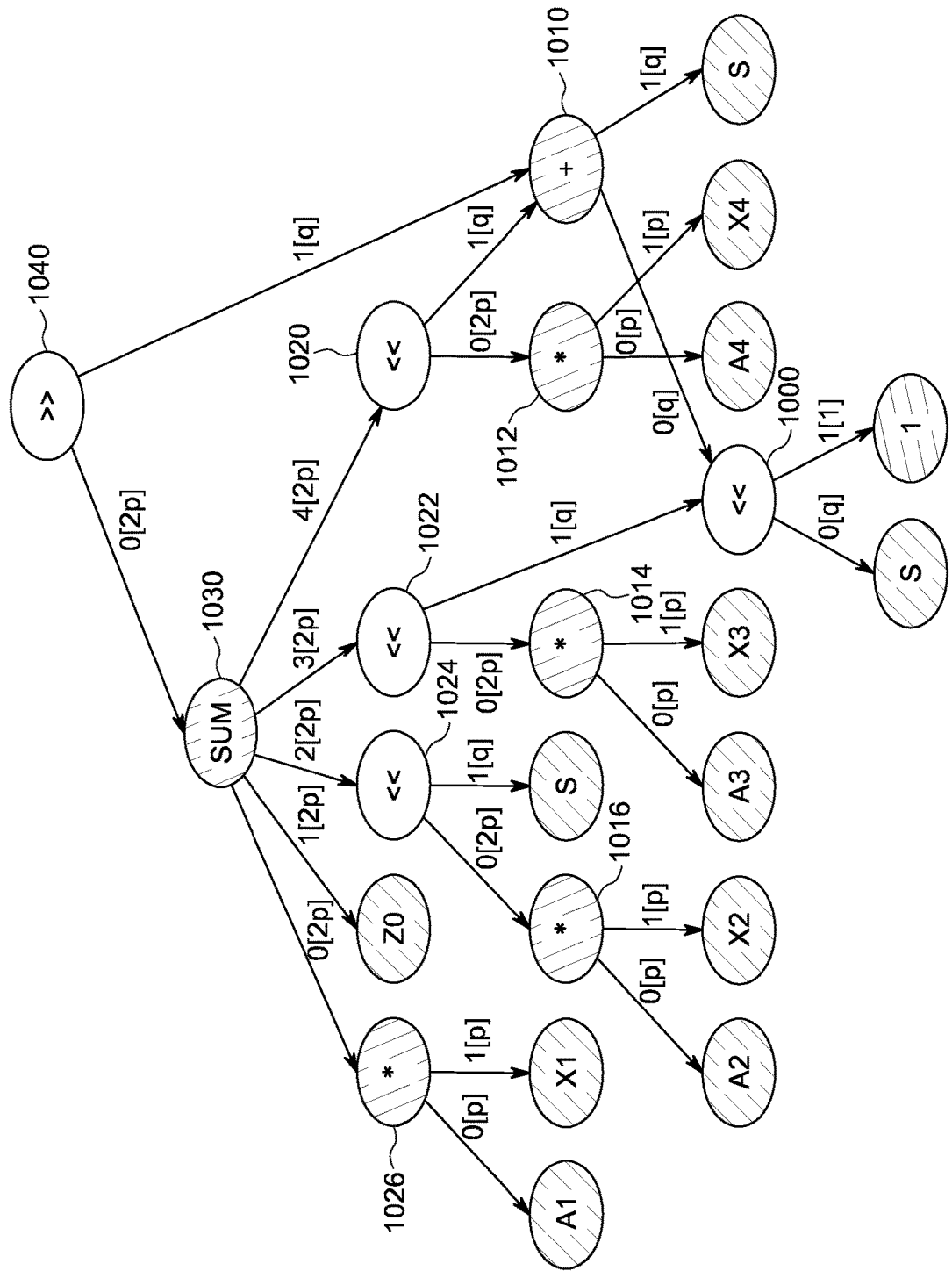

As can be seen in FIGS. 8 to 10, the edges between the vertices may comprise labels, such as 0[p] or 1[q]. These edge labels indicate the bit-width of the respective operator, with the "0" or "1" part indicating that the operand (or result of an operation performed by an operator) is used as $0^{th}$, $1^{st}$ etc. operand, and the [p] or [q] part indicating the bit-width of the respective operand. In other words, the processing circuitry may be configured to include a bit-width of the operands in the graph representation as edge labels of the edges between the vertices representing the operands (or the vertices representing operators that provide an operand) and the vertices representing the operators accessing the operands. Accordingly, the method may comprise including 115 a bit-width of the operands in the graph representation as edge labels of the edges between the vertices representing the operands and the vertices representing the operators accessing the operands. These edge labels may later be used to determine logical equivalence between operators, with some operators only available, or efficient, for a sub-set of the supported bit-widths. The bit-widths being used may change if the proposed concept is applied to parametrizable circuit designs, i.e., circuit designs that can be adapted according to a parameter, with the parameter specifying, explicitly or implicitly, the bit-width.

In the proposed concept, the graph representation is extended by adding logically equivalent operators to the graph. These logically equivalent operators are added as alternatives to the operators already present in the graphs. The process is illustrated in FIG. 2, where the operation x<<1 is logically equivalent to x×2, and is included as another logically equivalent alternative in the graph representation. Such a dense representation of equivalent graphs, and thus designs, by using a so-called equality graph to build the graph representation. Accordingly, the graph representation may be based on an equality graph. An equality graph is a graph that comprise multiple equivalent representations of at least a sub-graph of the graph.

To enrich the graph with the logically equivalent operators, the one or more logically equivalent operators are determined for the one or more operators represented by the one or more vertices of the first set of vertices of the graph. This may be done based on a set of rewrites, of which examples are shown in FIG. 5. In other words, the processing circuitry may be configured to determine the one or more logically equivalent operators based on a pre-defined set of logically equivalent transformations (i.e., the rewrites) between operators.

There are various types of possible logically equivalent transformations. Some logically equivalent transformations are derived from bit vector arithmetic. For example, the pre-defined set of logically equivalent transformation may comprise one or more transformations that are based on bit vector arithmetic, e.g., at least one of a transformation related to commutativity, a transformation related to multiplication associativity, a transformation related to addition associativity, a transformation related to distributing a multiplication over multiple additions, a transformation related to a sum of multiple instances of the same operand, a transformation related to a sum of multiple instances of the same operand, with one instance of the operand being part of a multiplication, a transformation related to an addition of zero, a transformation between a subtraction and an addition of a negation, a transformation related to a multiplication by one, and a transformation related to a multiplication by two. Some logically equivalent transformations may be derived from bit vector identity. For example, the pre-defined set of logically equivalent transformation may comprise one or more transformations that are based on bit vector identity, e.g., at least one of a transformation related to a merging of two left shift or two right shift operations, a transformation related to eliminating a redundant selection, a transformation between a negative value and an inverse, a transformation between an inverse and a negative value, and a transformation related to an inversion of a multiplication.

Some logically equivalent transformations may be derived from constant expansion. For example, the pre-defined set of logically equivalent transformation may comprise one or more transformations that are based on constant expansion, e.g., at least one of a transformation related to a multiplication by a constant, and a transformation related to an expansion of a multiplication of an operand by one to a multiplication of an operand by two.

Some logically equivalent transformations may be derived from arithmetic logic exchange. For example, the pre-defined set of logically equivalent transformation may comprise one or more transformations that are based on arithmetic logic exchange, e.g., at least one of a transformation related to a left or right shift applied to an addition, a transformation related to a left shift applied to a multiplication, a transformation related to expanding a selection comprising an addition, a transformation related to expanding a selection by inserting zero, a transformation related to expanding a selection by moving zero, and a transformation between a concatenation and an addition. Such exchanges may be used to substitute operators, e.g., such that an operator is replaced by another (or a group of other) operator(s). For example, the pre-defined set of logically equivalent transformations between operators may comprise at least one transformation for transforming two or more operators into two or more different operators. For example, the pre-defined set of logically equivalent transformations between operators may comprises at least one transformation for transforming a combination of a first operator and a first operand into a combination of a second operator and a second operand, with the first operator being different from the second operator and the first operand being different from the second operand. For example, a multiplication by $2^n$ may be performed by performing a bit shift. Accordingly, the second operator may be a shift operator.

Some logically equivalent transformations may be derived from merging operators. For example, the pre-defined set of logically equivalent transformation may comprise one or more transformations that are based on merging operators, e.g., at least one of a transformation related to merging additions using a summation operator, a transformation related to multiplexing arrays, and a transformation related to a fused multiply add (FMA). These transformations are directed at merging multiple operators, e.g., by transforming multiple additions into a single summation or by using a multiplex array operation instead of two multiplications of an operand and of its inverse. Accordingly, the pre-defined set of logically equivalent transformations between operators may comprise at least one transformation for transforming two or more operators into a single operator. For example, the single operator may be one of a merge summation operator, a multiplex array operator and a fused-multiply-add operator.

Not every transformation is suitable for every bit-width. For example, some specialized operators exist with support for a limited set of bit-widths. As a consequence, the logical equivalence of the one or more logically equivalent operators may depend on the bit-width of the operands being accessed by the one or more operators. Transformations that involve such operators may thus be limited to these bit-widths (or suffer inefficiencies that occur due to additional operators required for expanding the bit-widths). Accordingly, the processing circuitry is configured to determine the one or more logically equivalent operators based on the bit-width of the operands. Moreover, not every transformation is suitable for any content of an operand. In the right column of FIG. 5, some conditions are shown that may be observed when using the proposed transformations (with "True" meaning that no conditions are imposed). These conditions may be considered to be sufficient for safely rewriting the operators, but not necessary in all cases. For example, if these conditions hold, the rewrites can be applied correctly. However, in some cases, the conditions do not hold, and the rewrites can still be applied correctly.

Once the once or more logically equivalent operators are determined, they are inserted into the graph representation, with the result of the graph representation comprising the plurality of logically equivalent representations of the circuit. These logically equivalent representations may be extracted from the graph representation, e.g., by selecting one of the logically equivalent operators wherever logically equivalent operators are included in the graph representation.

However, not every representation may be equally favorable. For example, some representations may be more costly to manufacture as they require more silicon area. Some representations may have an increased power draw (also due to more silicon area or due to silicon structures that increase the power consumption). Some representations may yield a longer processing delay (when many operators have to be used in succession), limiting the maximal frequency of the circuit. Therefore, one of the representations may be selected that has desired properties with respect to aspects such as silicon area, power draw and processing delay. The processing circuitry may be configured to select one representation from the plurality of logically equivalent representations of the circuit based on a selection criterion, and to generate the RTL representation based on the selected representation. Accordingly, the method may comprise selecting 140 one representation from the plurality of logically equivalent representations of the circuit based on a selection criterion and generating 150 the RTL representation based on the selected representation. As outlined above, one possible selection criterion is the implementation cost (e.g., in terms of silicon area or power consumption). Accordingly, the representation may be selected based on an implementation cost of the representation. For example, the implementation cost may be based on at least one of a silicon area (or more general semiconductor area) required by the representation and a power consumption of the representation. Another possible criterion is the processing delay, i.e., how much time the circuit takes to provide its output based on the input. Accordingly, the representation may be selected based on a processing delay of the representation. The processing circuitry may be configured to determine the value underlying the selection criterion for the plurality of logically equivalent representations, i.e., of the implementation cost and/or processing delay, e.g., based on a database or data structure comprising information on the implementation cost and/or processing delay of the operators, and to select the representation based on a comparison of the determined values.

The RTL representation of the circuit is then generated based on one of the plurality of equivalent representations of the circuit, e.g., based on the selected representation. For example, the RTL representation may be derived from the graph representation, by using the operators and operands included in the representation.

As outlined above, in some cases, circuit designs may be parametrized, with the same general design being used for different bit-widths. However, such designs are often suboptimal for some of the supported bit-widths and may thus be improved using the proposed concept. For example, depending on the parameter, and thus bit-width chosen, different representations may be desirable. The selection of the representation may thus depend on the bit-width being used by the specific instance of the circuit. Accordingly, the processing circuitry may be configured to select one representation from the plurality of logically equivalent representations of the circuit based on a selection criterion, with the selection criterion being dependent on the bit-width of the operands, and to generate the RTL representation based on the selected representation. For example, the implementation cost (semiconductor area and/or power consumption) and processing delay of a representation may differ for different bit-widths. Consequently, the representation may be selected based on at least one of an implementation cost and a processing delay of the representation, with the implementation cost and/or processing delay being based on the bit-width of the operands. For some bit-widths, a first representation may be advantageous according to the selection criterion, and for some other bit-widths a second representation may be advantageous according to the selection criterion.

This can be leveraged to generate multiple designs, with each design being advantageous for a parameter or range of parameters (and thus bit-width or range of bit-widths). The concept is illustrated in connection with FIG. 7. The processing circuitry may be configured to select, for each of a plurality of pre-defined bit-widths of the operands, one representation from the plurality of logically equivalent representations of the circuit based on the selection criterion, and to generate an RTL representation for each pre-defined bit-width based on the respective selected representation. Accordingly, the method may comprise selecting 140, for each of a plurality of pre-defined bit-widths of the operands, one representation from the plurality of logically equivalent representations of the circuit based on the selection criterion and generating 150 an RTL representation for each pre-defined bit-width based on the respective selected representation. As shown in connection with FIGS. 8 to 10, for some bit-widths, the same representation (architecture) may be deemed to be advantageous according to the selection criterion, and thus selected. Accordingly, a separate RTL representation may be generated for each unique and/or non-duplicate representation selected. In some examples, a separate RTL representation may be generated for each pre-defined bit-width. For example, the respective RTL representation may be based on the respective bit-width, e.g., by hard-coding the bit-width as part of the RTL representation.

For example, the processing circuitry may be configured to output the generated RTL representation or representations, e.g., via a computer-readable medium or via a signal comprising the respective RTL representation or representations.

The interface circuitry 12 or means for communicating 12 may correspond to one or more inputs and/or outputs for receiving and/or transmitting information, which may be in digital (bit) values according to a specified code, within a module, between modules or between modules of different entities. For example, the interface circuitry 12 or means for communicating 12 may comprise circuitry configured to receive and/or transmit information.

For example, the processing circuitry 14 or means for processing 14 may be implemented using one or more processing units, one or more processing devices, any means for processing, such as a processor, a computer or a programmable hardware component being operable with accordingly adapted software. In other words, the described function of the processing circuitry 14 or means for processing may as well be implemented in software, which is then executed on one or more programmable hardware components. Such hardware components may comprise a general-purpose processor, a Digital Signal Processor (DSP), a micro-controller, etc.

For example, the storage circuitry 16 or means for storing information 16 may comprise at least one element of the group of a computer readable storage medium, such as a magnetic or optical storage medium, e.g., a hard disk drive, a flash memory, Floppy-Disk, Random Access Memory (RAM), Programmable Read Only Memory (PROM), Erasable Programmable Read Only Memory (EPROM), an Electronically Erasable Programmable Read Only Memory (EEPROM), or a network storage.

For example, the computer system 100 may be a workstation computer system, i.e., a computer system that is used locally by an individual engineer, or a server computer system, i.e., a computer system being used to serve functionality, such as the selection of the representation and the generation of the code, to one or client computers.

More details and aspects of the apparatus, device, method, computer program, and computer system are mentioned in connection with the proposed concept, or one or more examples described above or below (e.g., FIGS. 2 to 10). The apparatus, device, method, computer program, and computer system may comprise one or more additional optional features corresponding to one or more aspects of the proposed concept, or one or more examples described above or below.

Various examples of the present disclosure relate to a concept for an equality graph (e-graph)-based automatic RTL exploration, which may be used for capturing logic synthesis data-path improvements or optimizations. Various examples may address the challenge of providing a concept for a more efficient automatic circuit design improvement or optimization with a large design space exploration that may take into account hardware implementation cost.

In the proposed concept, raising the level of abstraction of circuit design to a word level optimization (or improvement) problem, graph structures, such as equality graphs (e-graphs) may be used constructively rewrite the circuit, optionally including bit-widths as edge labels, thereby generating a dense representation of many different designs. By introducing non-standard operators representing complex data-path blocks, the e-graph may capture the merging capabilities of logic synthesis tools. This dense representation of designs may enable a more efficient design space exploration, generating architectures that logic synthesis can better optimize.

One aspect of the proposed concept relates to an application of modified e-graphs to RTL improvement or optimization. Additionally, the e-graphs may be modified to incorporate bit-widths (as edge labels). The e-graphs may be modified with appropriate nodes and re-writes to reflect logic synthesis, which may improve correlation with hardware design.

The proposed approach may match the manual improvement or optimization by a skilled hardware engineer, facilitating faster RTL bring-up and potentially discovering novel architectures. It may benefit RTL teams, incubator programs and fabrication services, thus providing an additional layer of service in circuit design with respect to improvement/optimization and implementation. For example, the approach may be deployed in an Electronic Design Automation (EDA) tool suite.

The proposed concept was implemented, and logic synthesis results were obtained for original and equivalent automatically improved/optimized designs. The equivalent designs were formally verified against the original using a formal equivalence checking tool. In a FIR (Finite Impulse Response) Filter Kernel, the original design had an area of 1710 $\mu m^2$ vs. 679 $\mu m^2$ for the improved design (−60%). In an ADPCM (Adaptive Differential Pulse Code Modulation) Decoder design, the original design had an area of 103 $\mu m^2$ vs. 102 $\mu m^2$ in the improved design (−1%). In an APR (Asynchronous Packet Router) Kernel design, the original design hat an area of 550 $\mu m^2$ vs. 170 $\mu m^2$ for the improved design (−69%). In a Shifted FMA (Fused Multiply-Add) design, the original design had an area of 310 $\mu m^2$ vs. 210 $\mu m^2$ for the improved design (−32%), E-graphs provide a dense graphical representation of equivalence classes over expressions. They should be read bottom-up. FIG. 2 shows an illustration of an example of equality graph rewriting. Two examples can be seen in FIG. 2, where the second e-graph contains two nodes within a single equivalence class. Nodes (ellipses) represent operators/operands, and the dashed boxes represent equivalence classes. On the left side, the original graph 210 is shown (with the operation x×2). A rewrite rule 220 (x×2→x<<1) is used to insert the second operation in the modified graph 230. The left-hand e-graph 210 contains only x×2, but the right-hand e-graph 220 contains x×2 and x<<1, which are equivalent according to the rewrite. This implies that the distinct expressions represented by these nodes, namely x×2 and x<<1, are equivalent.

More information on the use of e-graphs can be found in Willsey, Max, et al. "Egg: Fast and extensible equality saturation." in Proceedings of the ACM on Programming Languages 5.POPL (2021): 1-29.1.

Rewrites of the form l→r define equivalence relations between expressions, l~r. Constructively applying rewrites to the e-graph, allows the e-graph to grow monotonically, so that the rewritten e-graph contains both the left- and right-hand side of the rewrite in the same equivalence class. In FIG. 2, the rewrite, x×2→x<<1, defines an equivalence of these two expressions. The right-hand side is added to the e-graph in the same class as the left-hand side.

The e-graph data structure is powerful as it contains the full history of all the rewritten expressions and can contain infinitely many equivalent expressions.

FIG. 3 shows a flow chart of an example of a transformation of a register transfer level design into a graph representation, and of an extraction of a register transfer level representation. The RTL 310 is transformed into an e-graph 320, on which re-writes 325 are applied, leading to a dense representation of equivalent design 330, which can then be used to generate an improved or optimized RTL representation 340. The diagram of FIG. 3 thus illustrates how an initial RTL design can be transformed into a dense representation of infinitely many equivalent designs and an optimized RTL can be extracted.

Combinational RTL operating on bit vectors can be viewed as a dataflow graph, with bit-widths as edge labels. This enables converting RTL into an initial e-graph. Applying re-writes to this e-graph, the space of equivalent designs can be explored, whilst maintaining a history of all the designs we have generated. For example, the rewrites may be a function of bit-width. The final e-graph may contain a dense representation of potentially infinitely many equivalent RTL designs. Examples of the operators used in the rewrites are described in FIG. 4, along with the associated architecture for more complex operators, which is relevant for operator costing. FIG. 4 shows a table of an example of operators used to improve arithmetic circuits, along with associated architectures for more complex operators. For example, the operators being used may include left/right shift, addition/subtraction, negation, multiplication, multiplexer, non/inversion, concatenate/truncate, comparison, summation, multiplex array (MUXAR) and fused multiply add (FMA).

The rewrites that can be conditionally applied to the e-graph (e.g., if the matched bit-widths satisfy certain constraints), are described in FIG. 5. FIG. 5 shows a table of an example of a (bit-width dependent) set of rewrites. Such rewrites facilitate design space exploration and enable complex merging of operations. The rewrites of FIG. 5 use a left subscript notation, $_p x$, denotes a bit vector x of length p bits. The * operator represents any from the set {+,×} in this context. Square brackets represent Verilog bit slicing, where a[x: y] means to take bits x down to y of a.

The proposed rewrites capture the capabilities of the logic synthesis tools to merge adjacent operators into a single data path block, often saving the cost of additional carry-propagate adders. They are described in the "Merging Ops" class in FIG. 5. For example, the MUXAR (multiplex arrays) operator exploits the identity below to implement multiplication involving a variable and its inverse in a single Datapath block. Square brackets indicate bit slicing here.

$$a*b + \overline{a}*c = \sum_{i=0}^{n}(a[i]?b:c) << i$$

Including bit-widths in the e-graph optimization enables to correctly evaluate the cost of implementing different operators in hardware. Using a relevant hardware cost metric that can differentiate between designs, an improved or optimal architecture can be selected from the set of designs in the e-graph. Since the e-graph is fundamentally based on equivalence, the selected architecture may be equivalent to the original design by construction.

More details and aspects of the concept for equality graph based automatic RTL exploration are mentioned in connection with the proposed concept or one or more examples described above or below (e.g., FIG. 1a to 1b, 6 to 10). The concept for equality graph based automatic RTL exploration may comprise one or more additional optional features corresponding to one or more aspects of the proposed concept, or one or more examples described above or below.

The proposed concept may be applied for automatic bit-width dependent improved or optimal architecture selection using e-graph optimization.

When building parameterizable RTL, designers typically only generate one implementation that is used for all possible parameterizations. Using a single RTL design for a range of parameterizations is sub-optimal but parameterizable RTL is highly valuable in the overall design process, improving efficiency.

Logic synthesis includes many bit-width dependent optimizations that it can deploy on RTL designs, so different parameterizations will likely be synthesized differently. Particularly for arithmetic circuits, Logic synthesis only explores a local region of design space close to the RTL implementation supplied and rarely crosses the architectural boundaries.

Some vendors provide parameterizable RTL, where the synthesized architecture is determined by the context. However, no facility is provided to automatically discover an improved optimal architecture for a designer's own implementations.

Applying the e-graph optimization method to parameterizable RTL provides an automatic method to generate different architectures dependent upon the parameterization. Having a range of RTLs automatically generated based off a single initial parameterizable design retains the ease-of-use benefits of parameterizable RTL, without sacrificing quality.

Figure 6:
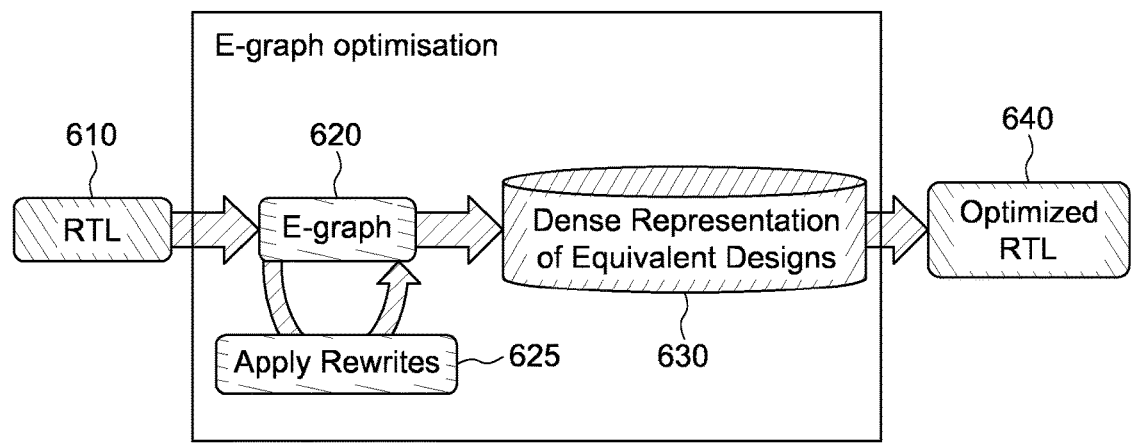
FIG. 6 shows a flow chart of an example of an automatic improvement of a register transfer level design.

FIG. 6 shows a flow chart of an example of an automatic improvement of a register transfer level design. The RTL 610 is transformed into an e-graph 620, on which re-writes 625 are applied, leading to a dense representation of equivalent design 630 (i.e., the e-graph optimization), which can then be used to generate an improved or optimized RTL representation 640.

Figure 7:
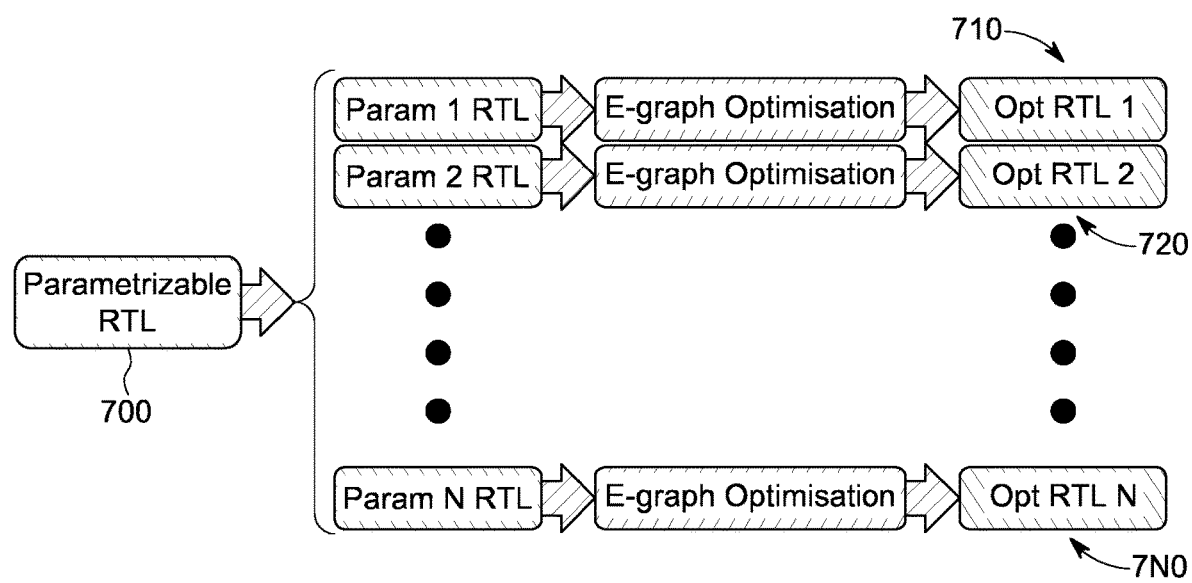
FIG. 7 shows a flow chart of an example of an automatic generation of improved register transfer level designs for a range of parameterizations.

In particular, as shown in FIG. 7, the e-graph improvement or optimization approach may be used to automatically generate a range of designs for a given parameterizable input design. FIG. 7 shows a flow chart of an example of an automatic generation of improved register transfer level designs for a range of parameterizations. As also shown in FIG. 6, the approach starts from the parametrizable RTL 700. For each parameter value (e.g., feasible bit width), a separate e-graph optimization is performed to obtain improved or optimized RTL 710-7N0.

Often RTL will be parameterized by bit-width, which provides a good example of how this method can be applied. FIG. 7 describes the flow of how this method can be used to generate a range of RTLs for a given input RTL. The resulting RTLs are likely improved or optimal for different ranges of parameterizations.

Different improved or optimized architectures emerge as the bit-width parameterization of a design changes because the tradeoffs of a given transformation are bit-width dependent. Even in a simple example, a 4-tap FIR filter, three architectures emerge as the bit-width of the inputs' ranges from 4 bits up to 64 bits (in 4-bit increments). FIGS. 8 to 10 show the differences between the output architectures. FIGS. 8 to 10 shows graphs of examples of different representations of a circuit. FIG. 8 shows architecture 0, which may be considered improved or optimal for a bit-width of 4. FIG. 9 shows architecture 1, which may be considered improved or optimal for bit-widths 8 to 28 and 36 to 48. FIG. 10 shows architecture 2, which may be considered improved or optimal for bit-widths 32 and 52 to 64.

The architecture 0 shown in FIG. 8 comprises the operation 800 (A1×X1), with both operands having the bit-width p, operation 810 (the result of operation 800+C), with both operands having the bit-width 2 p, operation 820 (the result of operation 810 right-shifted (>>) by S, with the result of operation 810 having a bit-width of 2 p and S (the number of bit shifts) having a bit-width of q, operation 825 (A2×X2), with both operands having the bit-width p, operation 830 (the result of operation 825+the result of operation 820), with both operands having the bit-width 2 p, operation 840 (the result of operation 830 right-shifted by S), with the result of operation 830 having a bit-width of 2 p and S (the number of bit shifts) having a bit-width of q, operation 845 (A3×X3), with both operands having the bit-width p, operation 850 (the result of operation 845+the result of operation 840, with both operands having the bit-width 2 p, operation 860 (the result of operation 850 right-shifted by S), with the result of operation 850 having a bit-width of 2 p and S (the number of bit shifts) having a bit-width of q, operation 865 (A4×X4), with both operands having the bit-width p, and operation 870 (the result of operation 865+the result of operation 860), with both operands having the bit-width 2 p.

The graph of FIG. 9 is logically equivalent to the graph of FIG. 8. The architecture 1 shown in FIG. 9 comprises the operation 900 (S<<1), with S having a bit-width of q and 1 having a bit-width of 1, operation 902 (A3×X3), with both operands having the bit-width p, operation 904 (A2×X2), with both operands having the bit-width p, operation 910 (the result of operation 900+S), with both operands having the bit-width q, operation 912 (the result of operation 902 shifted by the result of operation 900), with the result of operation 902 having a bit-width of 2 p and the result of operation 900 having the bit-width q, operation 914 (the result of operation 904<<S), with the result of operation 904 having a bit-width of 2 p and S having a bit-width of q, operation 916 (A1×X1), with both operands having the bit-width p, operation 920 (a sum of the results of operations 912, 914, 916 and Z0), with the operands each having a bit-width of 2 p, operation 930 (the result of operation 920 right-shifted (>>) by the result of operation 910), with the result of operation 920 having a bit-width of 2p and the result of operation 910 having a bit-width of q, operation 932 (A4×X4), with both operands having the bit-width p, and operation 940 (the result of operation 932+the result of operation 930), with both operands having the bit-width 2 p.

The graph of FIG. 10 is logically equivalent to the graphs of FIGS. 8 and 9. The architecture 2 shown in FIG. 10 comprises operation 1000 (S<<1), with S having a bit-width of q and 1 having a bit-width of 1, operation 1010 (the result of operation 1000+S), with both operands having a bit-width of q, operation 1012 (A4×X4), with both operands having the bit-width p, operation 1014 (A3×X3), with both operands having the bit-width p, operation 1016 (A2×X2), with both operands having the bit-width p, operation 1020 (the result of operation 1012<<the result of operation 1010), with the result of operation 1012 having a bit-width of 2 p and the result of operation 1010 having a bit-width of q, operation 1022 (the result of operation 1014<<the result of operation 1000), with the result of operation 1014 having a bit-width of 2 p and the result of operation 1000 having a bit-width of q, operation 1024 (the result of operation 1016<<S), with the result of operation 1016 having a bit-width of 2 p and S having a bit-width of q, operation 1026 (A1×X1), with both operands having the bit-width p, operation 1030 (the sum of operations 1020, 1022, 1024, 1026 and Z0), with each operand having a bit-width of 2 p, and operation 1040 (the result of operation 1030>>the result of operation 1010), with the result of operation 1030 having a bit-width of 2 p and the result of operation 1010 having a bit-width of q.

More details and aspects of the concept for automatic bit-width dependent improved or optimal architecture selection using e-graph optimization are mentioned in connection with the proposed concept or one or more examples described above or below (e.g., FIG. 1a to 6). The concept for automatic bit-width dependent improved or optimal architecture selection using e-graph optimization may comprise one or more additional optional features corresponding to one or more aspects of the proposed concept, or one or more examples described above or below.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

As used herein, the term "module" refers to logic that may be implemented in a hardware component or device, software or firmware running on a processing unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processing units, state machine circuitry, and/or firmware that stores instructions executable by programmable circuitry. Modules described herein may, collectively or individually, be embodied as circuitry that forms a part of a computing system. Thus, any of the modules can be implemented as circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processing units capable of executing computer-executable instructions to perform any of the disclosed methods. As used herein, the term "computer" refers to any computing system or device described or mentioned herein. Thus, the term "computer-executable instruction" refers to instructions that can be executed by any computing system or device described or mentioned herein.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, C#, assembly language, or any other programming language. Likewise, the disclosed technologies are not limited to any particular computer system or type of hardware.

Furthermore, any of the software-based examples (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electro-magnetic communications (including RF, microwave, ultrasonic, and infrared communications), electronic communications, or other such communication means.

The disclosed methods, apparatuses, and systems are not to be construed as limiting in any way. Instead, the present disclosure is directed toward all novel and nonobvious features and aspects of the various disclosed examples, alone and in various combinations and subcombinations with one another. The disclosed methods, apparatuses, and systems are not limited to any specific aspect or feature or combination thereof, nor do the disclosed examples require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus for generating a register transfer level (RTL) representation of a circuit, the apparatus comprising processing circuitry configured to:
    generate a graph representation of the circuit, the graph representation comprising a first set of vertices representing operators and a second set of vertices representing operands of the RTL representation of the circuit;
    determine, for one or more operators represented by the one or more vertices of the first set of vertices of the graph, one or more logically equivalent operators;
    include the one or more logically equivalent operators in the graph representation, such that the graph representation comprises a plurality of logically equivalent representations of the circuit; and
    generate an RTL representation of the circuit based on one of the plurality of equivalent representations of the circuit.

2. The apparatus according to claim 1, wherein the graph representation is based on an equality graph.

3. The apparatus according to claim 1, wherein the graph representation is a data-flow graph representing the circuit.

4. The apparatus according to claim 1, wherein the processing circuitry is configured to generate the graph representation from a further RTL representation of the circuit.

5. The apparatus according to claim 1, wherein the processing circuitry is configured to select one representation from the plurality of logically equivalent representations of the circuit based on a selection criterion, and to generate the RTL representation based on the selected representation.

6. The apparatus according to claim 5, wherein the representation is selected based on an implementation cost of the representation.

7. The apparatus according to claim 6, wherein the implementation cost is based on at least one of a silicon area required by the representation and a power consumption of the representation.

8. The apparatus according to claim 5, wherein the representation is selected based on a processing delay of the representation.

9. The apparatus according to claim 1, wherein the processing circuitry is configured to determine the one or more logically equivalent operators based on a pre-defined set of logically equivalent transformations between operators.

10. The apparatus according to claim 9, wherein the pre-defined set of logically equivalent transformations between operators comprises at least one transformation for transforming two or more operators into a single operator.

11. The apparatus according to claim 10, wherein the single operator is one of a merge summation operator, a multiplex array operator and a fused-multiply-add operator.

12. The apparatus according to claim 9, wherein the pre-defined set of logically equivalent transformations between operators comprises at least one transformation for transforming two or more operators into two or more different operators.

13. The apparatus according to claim 9, wherein the pre-defined set of logically equivalent transformations between operators comprises at least one transformation for transforming a combination of a first operator and a first operand into a combination of a second operator and a second operand, with the first operator being different from the second operator and the first operand being different from the second operand.

14. The apparatus according to claim 13, wherein the second operator is a shift operator.

15. The apparatus according to claim 1, wherein the processing circuitry is configured to include a bit-width of the operands in the graph representation as edge labels of the edges between the vertices representing the operands and the vertices representing the operators accessing the operands.

16. The apparatus according to claim 15, wherein the processing circuitry is configured to determine the one or more logically equivalent operators based on the bit-width of the operands.

17. The apparatus according to claim 16, wherein the logical equivalence of the one or more logically equivalent operators depends on the bit-width of the operands being accessed by the one or more operators.

18. The apparatus according to claim 16, wherein the processing circuitry is configured to select one representation from the plurality of logically equivalent representations of the circuit based on a selection criterion, with the selection criterion being dependent on the bit-width of the operands, and to generate the RTL representation based on the selected representation.

19. The apparatus according to claim 18, wherein the representation is selected based on at least one of an implementation cost and a processing delay of the representation, with the implementation cost and/or processing delay being based on the bit-width of the operands.

20. The apparatus according to claim 18, wherein the processing circuitry is configured to select, for each of a plurality of pre-defined bit-widths of the operands, one representation from the plurality of logically equivalent representations of the circuit based on the selection criterion, and to generate an RTL representation for each pre-defined bit-width based on the respective selected representation.

21. A method for generating a register transfer level (RTL) representation of a circuit, the method comprising:
    generating a graph representation of the circuit, the graph representation comprising a first set of vertices representing operators and a second set of vertices representing operands of the RTL representation of the circuit;
    determining, for one or more operators represented by the one or more vertices of the first set of vertices of the graph, one or more logically equivalent operators;
    including the one or more logically equivalent operators in the graph representation, such that the graph representation comprises a plurality of logically equivalent representations of the circuit; and
    generating an RTL representation of the circuit based on one of the plurality of equivalent representations of the circuit.

22. A non-transitory machine-readable storage medium including program code, when executed, to cause a machine to perform the method of claim 21.

* * * * *